(12) United States Patent
Dong et al.

(10) Patent No.: US 12,394,737 B2
(45) Date of Patent: Aug. 19, 2025

(54) DISPLAY PANEL AND DISPLAY DEVICE

(71) Applicant: WUHAN CHINA STAR OPTOELECTRONICS TECHNOLOGY CO., LTD., Hubei (CN)

(72) Inventors: Shuya Dong, Hubei (CN); Bo Liu, Hubei (CN); Qiang Gong, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 18/676,431

(22) Filed: May 28, 2024

(65) Prior Publication Data

US 2024/0312934 A1    Sep. 19, 2024

Related U.S. Application Data

(63) Continuation of application No. 17/623,375, filed as application No. PCT/CN2021/139693 on Dec. 20, 2021, now Pat. No. 12,021,049.

(30) Foreign Application Priority Data

Dec. 16, 2021   (CN) ......................... 202111546884.7

(51) Int. Cl.
*H01L 23/00*   (2006.01)
*H01L 25/18*   (2023.01)

(52) U.S. Cl.
CPC .............. *H01L 24/06* (2013.01); *H01L 24/05* (2013.01); *H01L 24/32* (2013.01); *H01L 25/18* (2013.01);

(Continued)

(58) Field of Classification Search
CPC ......... H01L 24/06; H01L 24/05; H01L 24/32; H01L 25/18; H01L 2224/05553;
(Continued)

(56) References Cited

U.S. PATENT DOCUMENTS

| | | | |
|---|---|---|---|
| 2010/0014030 A1* | 1/2010 | Lin | ...................... G02F 1/1345 349/84 |
| 2012/0256199 A1 | 10/2012 | Lee et al. | |
| 2019/0148327 A1 | 5/2019 | Chen et al. | |

FOREIGN PATENT DOCUMENTS

| | | |
|---|---|---|
| CN | 1629926 A | 6/2005 |
| CN | 107621710 A | 1/2018 |

(Continued)

OTHER PUBLICATIONS

Chinese Office Action issued in corresponding Chinese Patent Application No. 202111546884.7 dated Jul. 28, 2022, pp. 1-10.

(Continued)

*Primary Examiner* — Elias Ullah
(74) *Attorney, Agent, or Firm* — PV IP PC; Wei Te Chung

(57) ABSTRACT

The present disclosure provides a display panel and a display device. The display panel includes an array substrate. The array substrate includes a display area and a bonding area. The bonding area is positioned on a side of the display area, and a driving chip and a plurality of bonding pads are provided in the bonding area. The driving chip includes a first area adjacent to the display area and a second area far away from the display area. A plurality of first dummy terminals are provided in the first area, a plurality of driving terminals are provided in the second area, and the plurality of the driving terminals comprise a plurality of input terminals. The plurality of the input terminals have one-to-one correspondence with the plurality of the bonding pads.

19 Claims, 6 Drawing Sheets

(52) U.S. Cl.
CPC ............... *H01L 2224/05553* (2013.01); *H01L 2224/05568* (2013.01); *H01L 2224/0603* (2013.01); *H01L 2224/06132* (2013.01); *H01L 2224/06133* (2013.01); *H01L 2224/06515* (2013.01); *H01L 2224/32147* (2013.01); *H01L 2924/1426* (2013.01)

(58) Field of Classification Search
CPC ... H01L 2224/05568; H01L 2224/0603; H01L 2224/06132; H01L 2224/06133; H01L 2224/06515; H01L 2224/32147; H01L 2924/1426; H01L 24/09; H01L 24/08; G02F 1/13458; G09F 9/30; G09G 3/20
See application file for complete search history.

(56) References Cited

FOREIGN PATENT DOCUMENTS

| | | |
|---|---|---|
| CN | 109949703 A | 6/2019 |
| CN | 110579917 A | 12/2019 |
| CN | 111383554 A | 7/2020 |
| CN | 111554202 A | 8/2020 |
| CN | 111880344 A | 11/2020 |
| CN | 111883039 A | 11/2020 |
| CN | 112002715 A | 11/2020 |
| CN | 211956078 U | 11/2020 |
| CN | 112037649 A | 12/2020 |
| JP | 2004356566 A | 12/2004 |
| JP | 2020190588 A | 11/2020 |

OTHER PUBLICATIONS

International Search Report in International application No. PCT/CN2021/139693, mailed on Apr. 26, 2022.
Written Opinion of the International Search Authority in International application No. PCT/CN2021/139693, mailed on Apr. 26, 2022.

\* cited by examiner

DISPLAY PANEL AND DISPLAY DEVICE

CROSS-REFERENCE TO RELATED APPLICATION

This application is a continuation application of U.S. patent application Ser. No. 17/623,375, filed on Dec. 28, 2021, which is a US national phase application based upon an International Application No. PCT/CN2021/139693, filed on Dec. 20, 2021, which claims priority to Chinese Patent Application No. 202111546884.7, filed on Dec. 16, 2021. The disclosures of the aforementioned applications are incorporated herein by reference in their entireties.

FIELD OF INVENTION

The present disclosure relates to the field of display technologies, and particularly to a display panel and a display device.

BACKGROUND OF INVENTION

In order to relieve COG (Chip On Glass, where the chip is directly bound to the glass) display panels with a large lower frame, an improved design is made to driving chips to achieve a super narrow lower frame of the display panels. Specifically, the driving terminals for transmitting display signals are disposed on a side of the driving chip, and the driving terminals are not disposed in other areas. However, the driving terminals on the driving chip with this design are distributed unevenly, which will cause unbalance of the driving chip. When the driving chip is bound to the display panel, a "seesaw" effect will occur, and some of the driving terminals will be warped. As a result, conducting particles between the driving terminals and the display panel are shallow in conduction, and the driving terminals cannot be bound to pads of the display panels, which in turn causes performance degradation of the display panels or even fail to work properly.

SUMMARY

The present disclosure provides a display panel including an array substrate. The array substrate includes a display area and a bonding area. The bonding area is positioned on a side of the display area, and a driving chip and a plurality of bonding pads are provided in the bonding area. The driving chip including a first area adjacent to the display area and a second area far away from the display area. A plurality of first dummy terminals are provided in the first area, a plurality of driving terminals are provided in the second area, and the plurality of the driving terminals include a plurality of input terminals. The plurality of the input terminals have one-to-one correspondence with the plurality of the bonding pads.

The present disclosure provides a display device including the display panel.

DESCRIPTION OF DRAWINGS

In order to explain technical solutions in the embodiments of the present disclosure or in prior art more clearly, the following will introduce briefly the drawings used in the description of the embodiments of the present disclosure or of the prior art. Obviously, the drawings in the following description are merely several embodiments of the present disclosure. For those skilled in the art, other drawings can be obtained based on these drawings without creative work.

DETAILED DESCRIPTION OF EMBODIMENTS

Figure 1A:
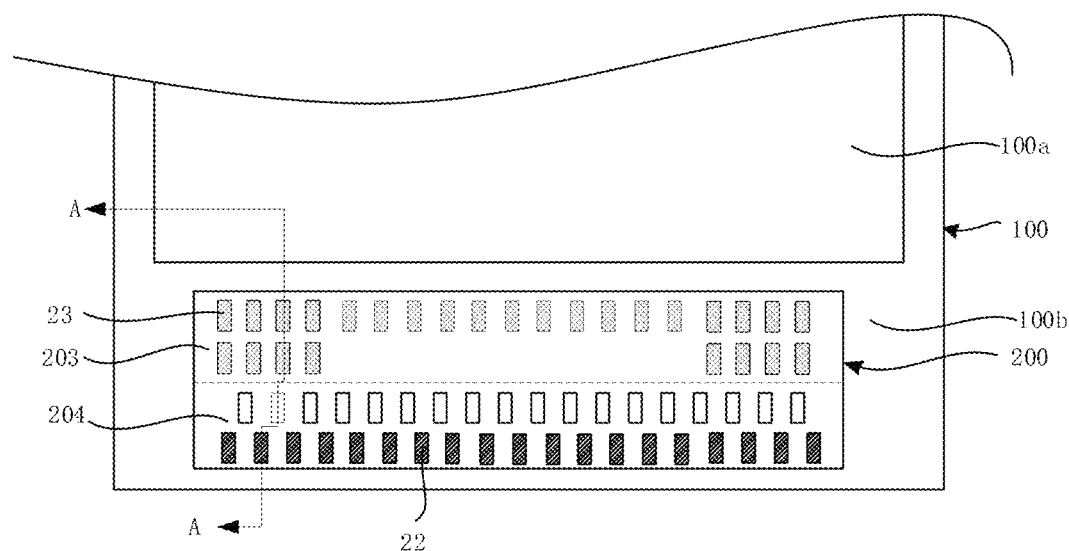
FIG. 1A is a schematic plane structural view of a display panel provided by an embodiment of the present disclosure.

The technical solutions in the embodiments of the present disclosure will be clearly and completely described with reference to the accompanying drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative work fall into protection scope of the present disclosure. Additionally, it should be understood that the specific embodiments described herein are merely intended to illustrate and interpret the invention and are not intended to limit the invention. In the present disclosure, without contrary statement, orientational terms such as "up" and "down" are normally used to refer to up and down of the device in actual use or operation, specifically the orientations shown in the drawings; and "inside" and "outside" refer to contours of the device.

Figure 1B:
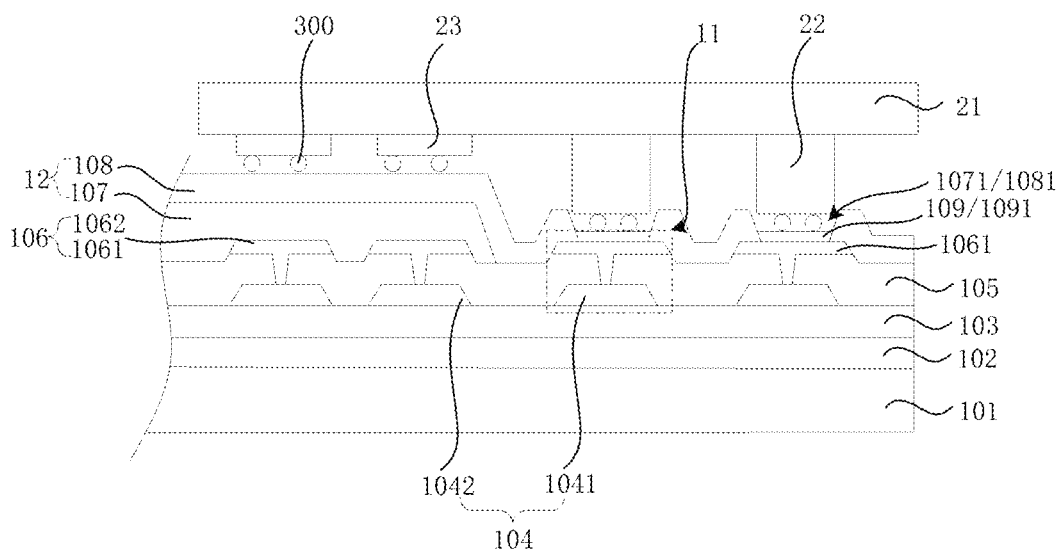
FIG. 1B is a schematic cross-sectional view of the display panel in FIG. 1A along A-A.
Figure 2:
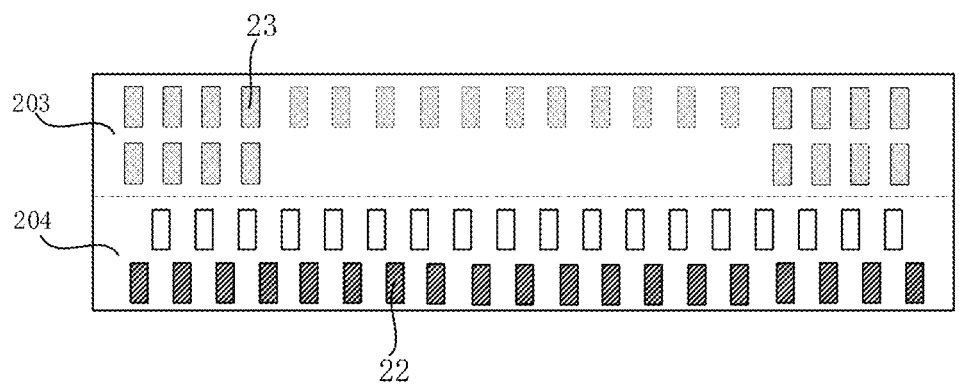
FIG. 2 is a first schematic plane structural view of a driving chip provided by an embodiment of the present disclosure.

Referring to FIG. 1A, FIG. 1B, and FIG. 2, FIG. 1A is a schematic plane structural view of a display panel provided by an embodiment of the present disclosure; FIG. 1B is a schematic cross-sectional view of the display panel in FIG. 1A along A-A; and FIG. 2 is a first schematic plane structural view of a driving chip provided by an embodiment of the present disclosure. An embodiment of the present disclosure provides a display panel, the display panel includes an array substrate 100. The array substrate 100 includes a display area 100a and a bonding area 100b, and the bonding area 100b is positioned on a side of the display area 100a. A driving chip 200 and a plurality of bonding pads 11 are provided in the bonding area 100b. The driving chip 200 is bound to the plurality of the bonding pads 11 in the bonding area 100b, that is, the driving chip 200 is bound to a glass (Chip On Glass, COG). The plurality of the bonding pads 11 are arranged in straight lines along a direction from the from the display area 100a to the bonding area 100b, the straight lines are side by side.

The driving chip 200 includes a first area 203 adjacent to the display area 100a and a second area 204 far away from the display area 100a. A plurality of first dummy terminals are provided in the first area 203. A plurality of driving terminals 22 are provided in the second area 204, and the plurality of the driving terminals 204 include a plurality of input terminals 221. The plurality of the input terminals 221 have one-to-one correspondence with the plurality of the bonding pads 11, thereby transmitting signals from the driving chip 200 to the display area 100a.

A conducting resin is provided between the driving chip 200 and the array substrate 100. A plurality of conducting particles 300 are distributed in the conducting resin. The driving chip 200 and the array substrate 100 are electrically connected by squeezing the conducting particles 300.

After the driving chip 200 is aligned with the array substrate 100, since the first area 203 in the prior art has a blank area that is not provided with any terminals, a distribution of supporting forces in the blank area and other areas is uneven, which causes unbalance of the driving chip 200, thereby causing: an end of the driving chip 200 adjacent to the blank area to tilt to a side adjacent to the array substrate 100, an end of the driving chip 200 far away from the blank area to be warped far away from the array substrate, the driving terminals 22 of the driving chip 200 far away from the blank area to be warped, the conducting particles 300 in the conducting resin not to be squeezed and deformed by the driving terminals 22 and the bonding pads 11, the driving terminals 22 not to be electrically and correspondingly connected to the bonding pads 11, and some of the driving terminals 22 to be shallow in conduction.

In view of this, a plurality of first dummy terminals 23 are provided in the above blank area in embodiments of the present disclosure, that is, the plurality of the first dummy terminals 23 are provided in the first area 203. An insulation protective layer 12 is provided on a part of the array substrate 100 which is corresponding to the first dummy terminals 23.

In can be understood, in embodiments of the present disclosure, the input terminals 221 are electrically connected to the bonding pads 11 to transmit electrical signals. The first dummy terminals 23 are disposed upon the insulation protective layer 12, that is, the first dummy terminals 23 are insulated from metal wirings on the array substrate 100. Thus, the first dummy terminals 23 merely plays a supporting role and do not transmit electrical signals.

Since the first dummy terminals 23 and the insulation protective layer 12 have certain thicknesses, the certain thicknesses can compensate for a height difference caused by warping of the driving terminals 22 on the driving chip 200 when the driving chip 200 is bound. Thus, the end of the driving chip 200 far away from the display area 100a will not be warped, the conducting particles 300 in the conducting resin can be squeezed and deformed by the driving terminals 22 and the bonding pads 11, thereby ensuring the driving chip 200 to be bound to the array substrate 100 properly and preventing the driving terminals 22 from being shallow in conduction. Additionally, the metal wirings on the array substrate 100 of the present disclosure are covered by the insulation protective layer 12, which can prevent the conducting particles 300 from causing crush damage to the metal wirings on the array substrate 100.

Specifically, referring to FIG. 1B, a film structure of the array substrate 100 is now described.

The array substrate 100 includes a base substrate 101, a first metal layer 104, an interlayer insulation layer 105, a second metal layer 106, a planarization layer 107, a first transparent conducting layer, and a passivation layer 108, which are successively stacked. Furthermore, the array substrate 100 further includes a shielding layer (not shown in the figure), a buffer layer 102, a semiconductor layer, and a gate insulation layer 103.

The shielding layer is disposed on a side of the base substrate 101 and is disposed in the display area 100a. The buffer layer 102 covers the shielding layer and the base substrate 101. The buffer layer 102 is disposed in the display area 100a and the bonding area 100b. The semiconductor layer is disposed on the buffer layer 102 and is disposed in the display area 100a. The gate insulation layer 103 covers the semiconductor layer and the buffer layer 102, and the gate insulation layer 103 is disposed in the display area 100a and the bonding area 100b.

The first metal layer 104 is disposed on the gate insulation layer 103. The first metal layer 104 includes gate electrodes, first metal constructions 1041, and second metal constructions 1042. The gate electrodes are disposed in the display area 100a, and the first metal constructions 1041 and the second metal constructions 1042 are disposed in the bonding area 100b. The interlayer insulation layer 105 covers the first metal layer 104 and the gate insulation layer 103, and the gate insulation layer 103 is disposed in the display area 100a and the bonding area 100b. The second metal layer 106 is disposed on the interlayer insulation layer 105. The second metal layer 106 includes third metal constructions 1061 and fourth metal constructions 1062. The third metal constructions 1061 are electrically connected with the first metal constructions 1041 through via holes which pass through the interlayer insulation layer 105. The fourth metal constructions 1062 are electrically connected with the second metal constructions 1042 through via holes which pass through the interlayer insulation layer 105.

The planarization layer 107 covers the second metal layer 106 and the interlayer insulation layer 105. The planarization layer 107 includes first openings 1071 disposed in the bonding area 100b. The third metal constructions 1061 are exposed from the first openings 1071.

In the display area 100a, the passivation layer 108 covers the first transparent conducting layer; and in the bonding area 100b, the passivation layer 108 covers the planarization layer 107, the interlayer insulation layer 105, the third metal constructions 1061, and the fourth metal constructions 1062. The passivation layer 108 includes second openings 1081. The second openings 1081 correspond to the first openings 1071. The first transparent conducting layer 109 is disposed on a side of the passivation layer 108 far away from the base substrate 101. The first transparent conducting layer 109 includes first transparent conducting members 1091 disposed in the bonding area 100b. The array substrate 100 further includes a second transparent conducting layer (not shown in the figure). The second transparent conducting layer is disposed on the planarization layer 107 and is disposed in the display area 100a. The second transparent conducting layer is a common electrode layer.

It can be understood, the first metal construction 1041, the third metal construction 1061, and the first transparent conducting member 1091 make up the bonding pad 11. In embodiments of the present disclosure, the planarization layer 107 and the passivation layer 108 are not provided on the bonding pads 11, meanwhile a part of the array substrate 100 which is corresponding to the first dummy terminals 23 is provided with the planarization layer 107 and the passivation layer 108. The planarization layer 107 and the passivation layer 108 provide protection for the metal wirings on the array substrate 100 which corresponding to the first dummy terminals 23. Even if the first dummy terminals 23 are provided on the driving chip 200, the first dummy terminals 23 does not cause damage to the metal wirings. That is, an arrangement of the first dummy terminals 23 does not cause damage to the metal wirings. Additionally, under this premise, the arrangement of the first dummy terminals 23 can compensate the height difference caused by warping of driving terminals 22, thereby relieving defects caused by the warping of the driving terminals 22.

Referring to FIG. 2, when the first area 203 of the driving chip 200 in the prior art is all blank, all the driving terminals 22 in the second area 204 will be warped. Thus, in the embodiment, the first dummy terminals 23 are disposed in the first area 203, thereby compensating the height difference caused by warping of driving terminals 22, and relieving defects caused by the warping of the driving terminals 22.

Figure 3A:
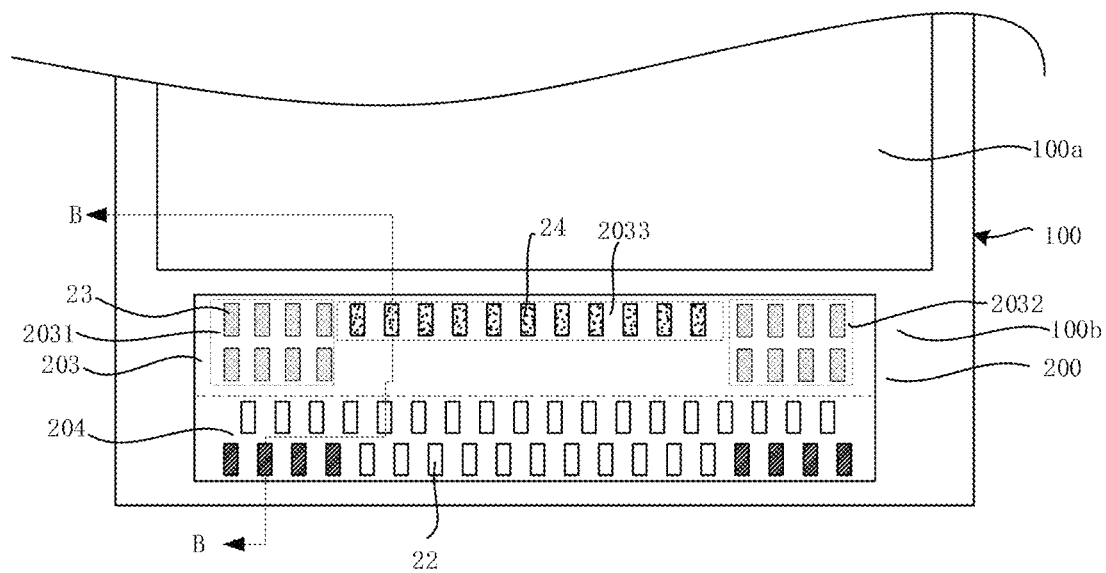
FIG. 3A is another schematic plane structural view of a display panel provided by an embodiment of the present disclosure.
Figure 3B:
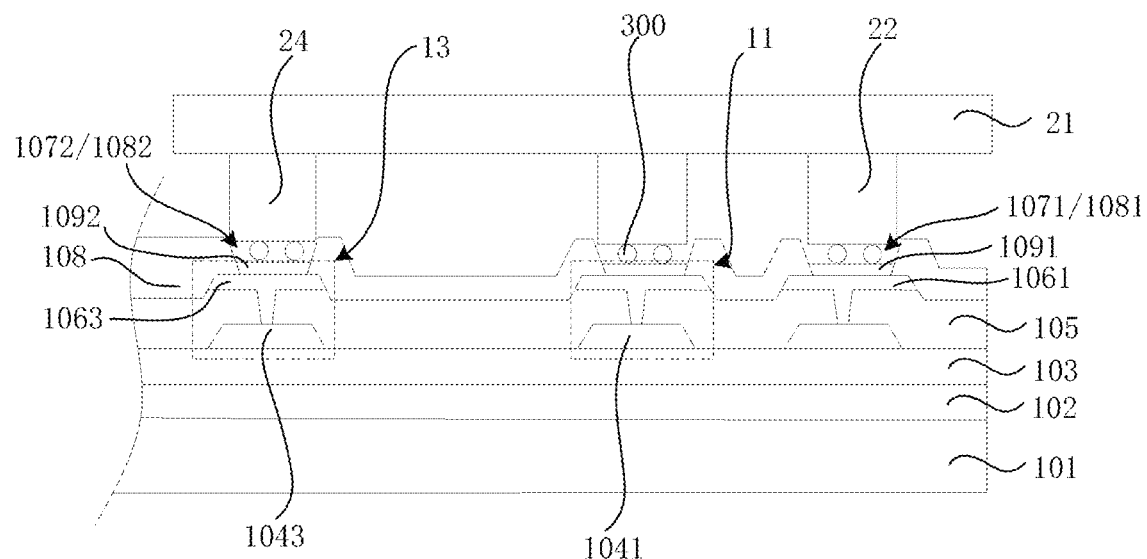
FIG. 3B is a schematic cross-sectional view of the display panel in FIG. 3A along B-B.
Figure 4:
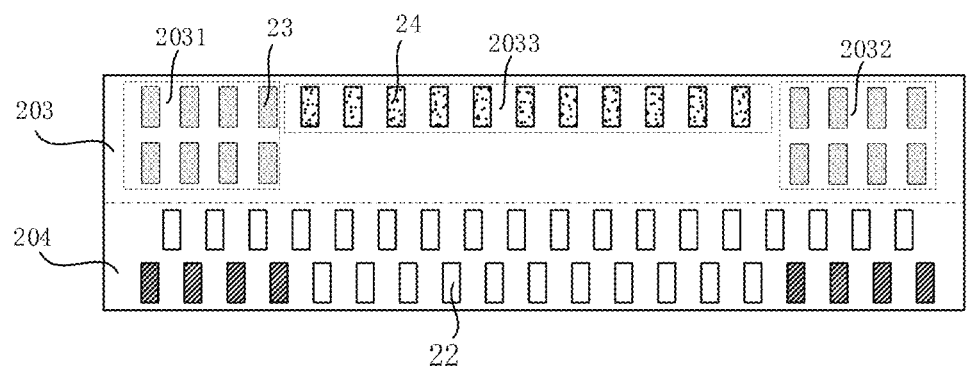
FIG. 4 is a second schematic plane structural view of the driving chip provided by an embodiment of the present disclosure.

In addition, in an embodiment, the first area 203 is further provided with a plurality of second dummy terminals 24. Referring to FIG. 3A, FIG. 3B, and FIG. 4, FIG. 3A is another schematic plane structural view of a display panel provided by an embodiment of the present disclosure; FIG. 3B is a schematic cross-sectional view of the display panel in FIG. 3A along B-B; and FIG. 4 is a second schematic plane structural view of the driving chip provided by an embodiment of the present disclosure. A plurality of dummy pads 13 are also provided in the bonding area 100b. The plurality of the second dummy terminals 24 have one-to-one correspondence with the plurality of the dummy pads 13.

It should be noted that the second dummy terminals 24 also merely plays a supporting role and do not transmit electrical signals. When the first area 203 is provided with the second dummy terminals 24, the second dummy terminals 24 are correspondingly connected with the dummy pads 13 on the display panel one by one, therewith the driving terminals 22 in the second 204 being correspondingly connected with the bonding pads 11 on the display panel one by one, and the driving terminals 22 will not be warped. In prior art, other areas in the first area 203 without the second dummy terminals 24 disposed are not provided with dummy terminals, thereby causing part of the driving terminals 22 to become warped and unable to connect with the corresponding binding pads 11. Thus, in the embodiment, the other areas in the first area 203 without the second dummy terminal 24 disposed are provided with the first dummy terminals 23, thereby compensating the height difference caused by warping of driving terminals 22 and relieving defects caused by the warping of the driving terminals 22.

In addition, referring to FIG. 3B, the first metal layer 104 further includes fifth metal constructions 1043 disposed in the bonding area 100b, the second metal layer 106 further includes sixth metal constructions 1063 disposed in the bonding area 100b, and the first transparent conducting layer 109 further includes second transparent conducting members 1092 disposed in the bonding area 100b. The planarization layer 107 further includes third openings 1072, and the sixth metal constructions 1063 are exposed from the third openings 1072. The passivation layer 108 further includes fourth openings 1082, and the fourth openings 1082 correspond to the third openings 1072. The fifth metal construction 1043, the sixth metal construction 1063, and the second transparent conducting member 1092 make up the dummy pad 11.

In addition, in this setting mode, an end surface of a portion of the array substrate 100 corresponding to the first dummy terminals 23 away from the base substrate 101 is higher than an end surface of a portion of the array substrate 100 corresponding to the bonding pads 11 and the dummy pads 13 away from the base substrate 101. That is, a distance between the end surface of the portion of the array substrate 100 corresponding to the first dummy terminals 23 away from the base substrate 101 and the base body 21 of the driving chip 20 is less than a distance between the end surface of the portion of the array substrate 100 corresponding to the bonding pads 11 and the dummy pads 13 away from the base substrate 101 and the base body 21 of the driving chip 20, thereby providing enough space for the conducting resin. Thus, in an embodiment of the present disclosure, a distance between an end surface of the first dummy terminal 23 far away from the base body 21 and the base body 21 is less than a distance between an end surface of the second dummy terminal far away from the base body 21 and the base body 21. Of course, the invention is not limited to this.

Figure 5:
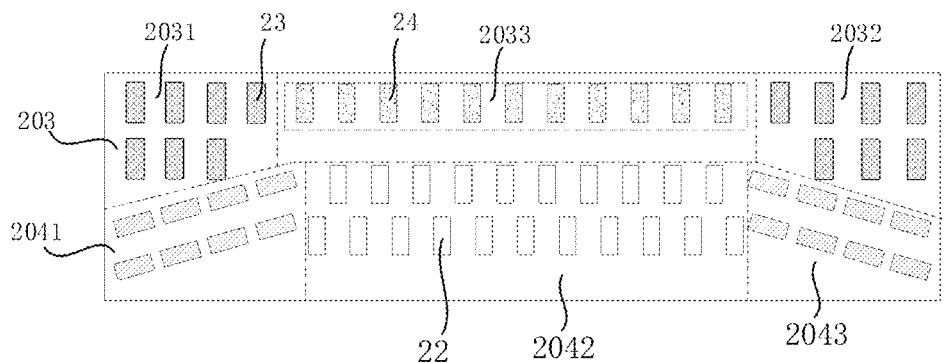
FIG. 5 is a third schematic plane structural view of the driving chip provided by an embodiment of the present disclosure.
Figure 6:
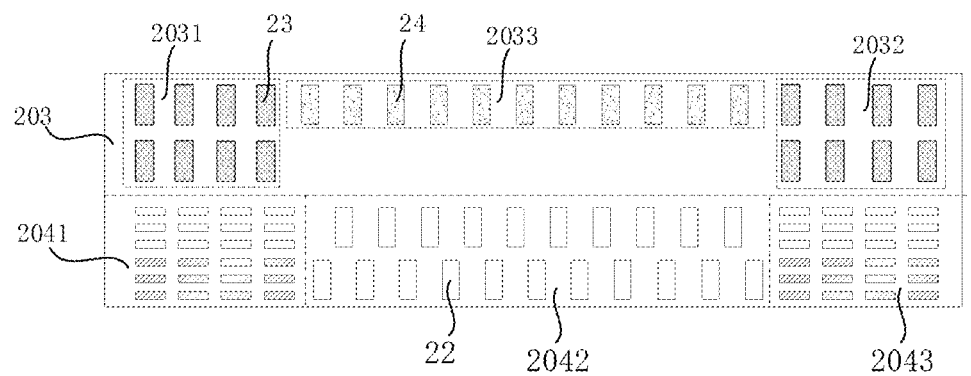
FIG. 6 is a fourth schematic plane structural view of the driving chip provided by an embodiment of the present disclosure.

In an embodiment, referring to FIG. 4, FIG. 5, and FIG. 6, the first area 203 includes a first sub area 2031 and a second sub area 2032 located on both sides, and an intermediate area 2033 located between the first sub area 2021 and the second sub area 2032. The plurality of the first dummy terminals 23 are disposed in the first sub area 2031 and the second sub area 2032, and the plurality of the second dummy terminals 24 are disposed in the intermediate area 2033. In prior art, since left and right sides of the second dummy terminals 24 are not provided with the second dummy terminals, part of the driving terminals 22 are caused to become warped and unable to connect with the corresponding bonding pads 11. Meanwhile, in embodiments of the present disclosure, areas beside left and right sides of the second dummy terminals 24 are provided with the first dummy terminals 23, that is, the first dummy terminals 23 are provided in the first sub area 2031 and the second sub area 2032 to compensate the height difference caused by warping of driving terminals 22, thereby relieving defects caused by the warping of the driving terminals 22.

In an embodiment, referring to FIG. 4, the plurality of the driving terminals 22 are arranged in at least two rows, and distances between each of the driving terminals 22 in a same row and the first area 203 are equal.

In an embodiment, referring to FIG. 5, the second area 204 of the driving chip 200 includes a third sub area 2041 corresponding to the first sub area 2031, a fourth sub area 2042 corresponding to the intermediate area 2033, and a fifth sub area 2043 corresponding to the second sub area 2032. Distances between each of the driving terminals 22 in a same row in the fourth sub area 2042 and the first area 203 are equal. Along a direction from the third sub area 2041 to the fourth area 2042, distances between each of the driving terminals 22 in a same row in the third sub area 2041 and the first area 203 are gradually decreased, and distances between each of the driving terminals 22 in a same row in the fifth sub area 2043 and the first area 203 are gradually increased.

It can be understood, the third sub area 2041 and the fifth sub area 2043 are located on opposite sides of the fourth sub area 2042. The driving terminals 22 in the third sub area 2041 are arranged in a sinking manner, and the driving terminals 22 in the fifth sub area 2043 are arranged in a sinking manner. In this arrangement, when the driving chip 200 is bound to the array substrate 100 in COG mode, the plurality of the bonding pads 11 of the array substrate 100 are also arranged in a sinking manner at both ends, so that a bending area of fanout lines can be disposed in the bonding area 100b, and then a width of a frame where the fanout area of the array substrate 100 is located is reduced to achieve a narrow frame.

In an embodiment, referring to FIG. 6, the second area 204 of the driving chip 200 includes a third sub area 2041 corresponding to the first sub area 2031, a fourth sub area 2042 corresponding to the intermediate area 2033, and a fifth sub area 2043 corresponding to the second sub area 2032. Each row of the driving terminals 22 in the fourth sub area 2042 correspond to at least two rows of the driving terminals 22 in the third sub area 2041 and the fifth sub area 2043. In this arrangement, the fanout lines may be electrically connected from a side of the third sub area 2041 to ends of the driving terminals 22, or the fanout lines may be electrically connected from a side of the fifth sub area 2043 to ends of the driving terminals 22, thereby saving wiring space and further narrowing the lower border of the array substrate 100.

Figure 7:
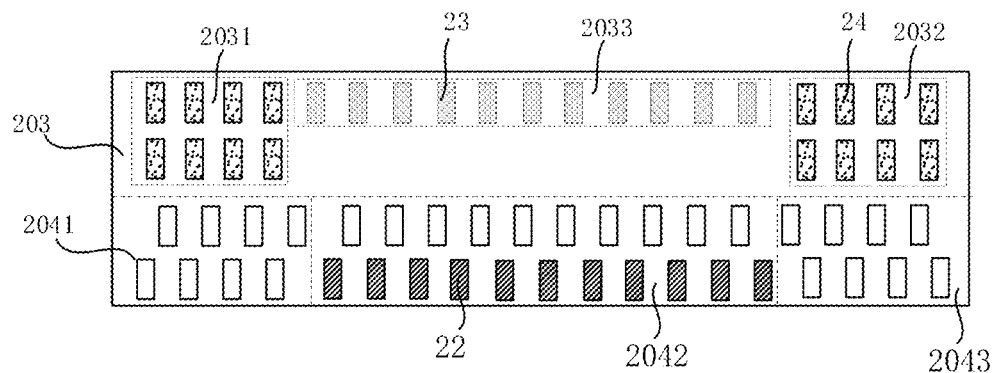
FIG. 7 is a fifth schematic plane structural view of the driving chip provided by an embodiment of the present disclosure.
Figure 8:
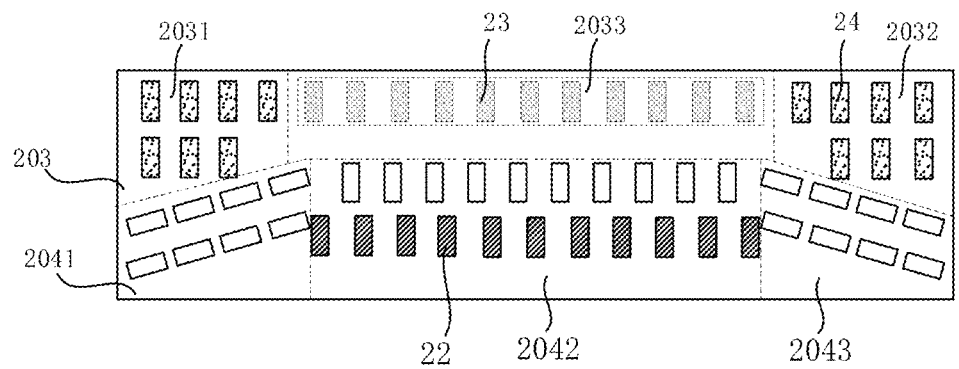
FIG. 8 is a sixth schematic plane structural view of the driving chip provided by an embodiment of the present disclosure.
Figure 9:
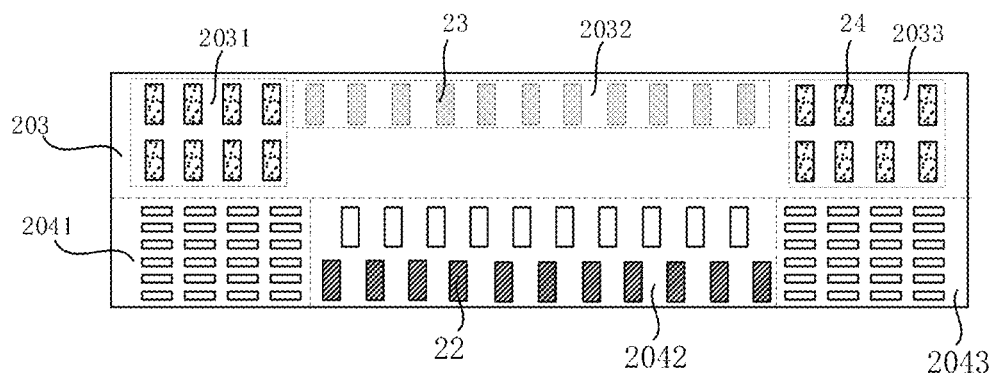
FIG. 9 is a seventh schematic plane structural view of the driving chip provided by an embodiment of the present disclosure.

In an embodiment, referring from FIG. 7 to FIG. 9, FIG. 7 is a fifth schematic plane structural view of the driving chip provided by an embodiment of the present disclosure; FIG. 8 is a sixth schematic plane structural view of the driving chip provided by an embodiment of the present disclosure; and FIG. 9 is a seventh schematic plane structural view of the driving chip provided by an embodiment of the present disclosure.

In prior art, the second dummy terminals 24 are arranged at left and right ends of the first area 203, and a middle area of the first area 203 is not provided with the second dummy terminals, so that part of the driving terminals 22 are warped and cannot be connected with the corresponding bonding pads 11. Thus, in an embodiment of the present disclosure, the first dummy terminals 23 are provided in the middle area of the first area 203, that is, the second dummy terminals 24 are disposed in the first sub area 2031 and the second sub area 2032, and the plurality of the first dummy terminals 23 are disposed in the intermediate area 2033, thereby compensating the height difference caused by warping of driving terminals 22 and relieving defects caused by the warping of the driving terminals 22.

In an embodiment, referring from FIG. 7, the plurality of the driving terminals 22 are arranged in at least two rows, and distances between each of the driving terminals 22 in a same row and the first area 203 are equal.

In an embodiment, referring from FIG. 8, the first area 203 includes a first sub area 2031 and a second sub area 2032 located on both sides, and an intermediate area 2033 located between the first sub area 2021 and the second sub area 2032. The plurality of the second dummy terminals 24 are disposed in the first sub area 2031 and the second sub area 2032, and the plurality of the first dummy terminals 23 are disposed in the intermediate area 2033. The second area 204 includes a third sub area 2041, a fourth sub area 2042, and a fifth sub area 2043. Distances between each of the driving terminals 22 in a same row in the fourth sub area 2042 and the first area 203 are equal. Along a direction from the third sub area 2041 to the fourth area 2042, distances between each of the driving terminals 22 in a same row in the third sub area 2041 and the first area 203 are gradually decreased, and distances between each of the driving terminals 22 in a same row in the fifth sub area 2043 and the first area 203 are gradually increased.

Similarly, the third sub area 2041 and the fifth sub area 2043 are located on opposite sides of the fourth sub area 2042. The driving terminals 22 in the third sub area 2041 are arranged in a sinking manner, and the driving terminals 22 in the fifth sub area 2043 are arranged in a sinking manner. In this arrangement, when the driving chip 200 is bound to the array substrate 100 in COG mode, the plurality of the bonding pads 11 of the array substrate 100 are also arranged in a sinking manner at both ends, so that a bending area of fanout lines can be disposed in the bonding area 100b, and then a width of a frame where the fanout area of the array substrate 100 is located is reduced to achieve a narrow frame.

In an embodiment, referring to FIG. 9, each row of the driving terminals 22 in the fourth sub area 2042 correspond to at least two rows of the driving terminals 22 in the third sub area 2041 and the fifth sub area 2043. Similarly, in this arrangement, the fanout lines may be electrically connected from a side of the third sub area 2041 to ends of the driving terminals 22, or the fanout lines may be electrically connected from a side of the fifth sub area 2043 to ends of the driving terminals 22, thereby saving wiring space and further narrowing the lower border of the array substrate 100.

Figure 10:
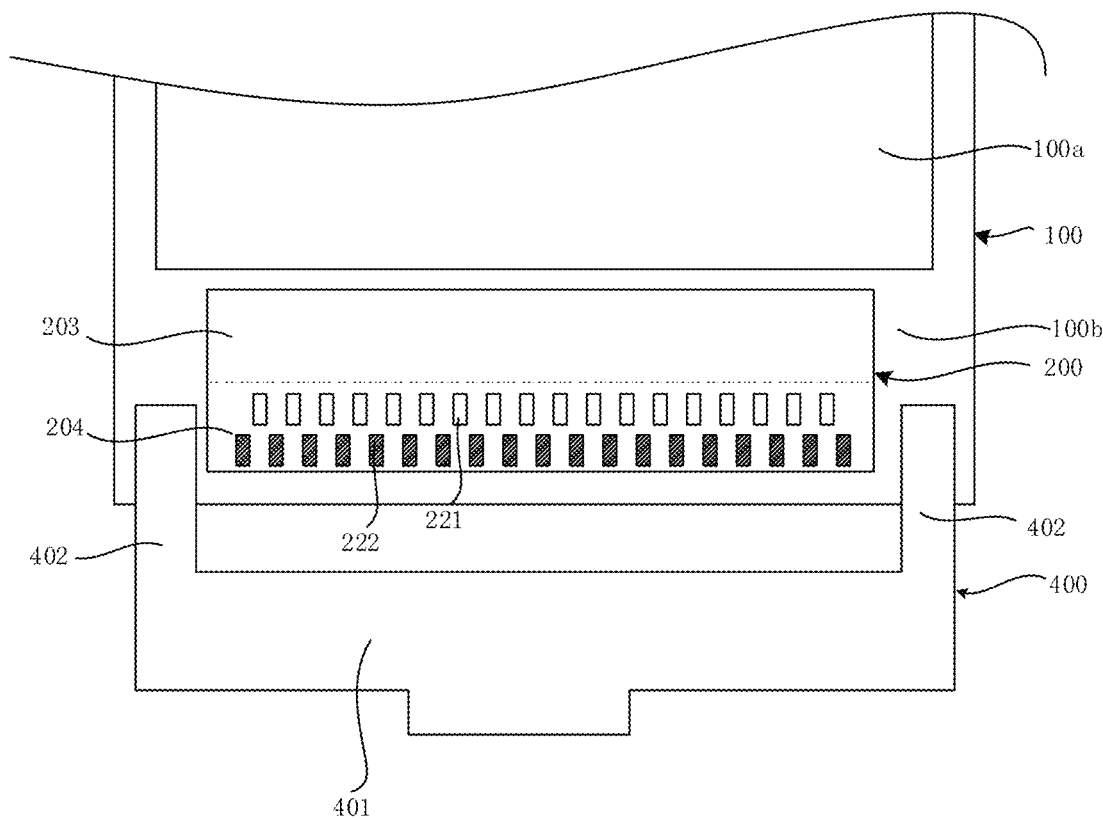
FIG. 10 is another schematic plane structural view of a display panel provided by an embodiment of the present disclosure.

Referring to FIG. 10, FIG. 10 is another schematic plane structural view of a display panel provided by an embodiment of the present disclosure. The display panel 100 further includes a flexible printed circuit board 400 disposed in the bonding area 100b. The flexible printed circuit board 400 includes a main body section 401 and connecting sections 402. The main body section 401 is disposed on a side of the driving chip 200 far away from the display area 100a, and the connecting sections 402 are disposed on two opposite sides of the driving chip 200. The driving terminals 22 further include a plurality of output terminals 222, and the plurality of the output terminals 222 are electrically connected with the flexible printed circuit board 400.

The present disclosure further provides a display device, and the display device includes the display panel in the above embodiments. The display device may be a fixed terminal, such as a television (TV) and a desktop computer, a mobile terminal, such as a mobile phone, a notebook computer, or a wearable device, such as a bracelet, a virtual display (VR) device, and an enhanced display (AR) device.

Beneficial effects of the present disclosure are: in the display panel and the display device provided by the present disclosure, the plurality of the first dummy terminals are added and disposed in the first area of the driving chip adjacent to the display area, the first dummy terminals support the driving terminals disposed in the second area and can compensate a height difference caused by warping of the driving terminals when the driving chip is bound, thereby ensuring that the driving chip can be well bound to the display panel to avoid shallow conduction. Additionally, the insulation protective layer is provided on a part of the array substrate which is corresponding to the first dummy terminals, thereby preventing metal wirings from extrusion damage caused by conducting particles.

In summary, although the present disclosure has been disclosed as above in preferred embodiments, the above-mentioned preferred embodiments are not intended to limit the present disclosure. Those of ordinary skills in the art, without departing from the spirit and scope of the present disclosure, various changes and modifications can be made, so the protection scope of the present disclosure is subject to the scope defined by the claims.

What is claimed is:

1. A display panel, comprising an array substrate,
wherein the array substrate comprises a display area and a bonding area, the bonding area is positioned on a side of the display area, and a driving chip and a plurality of bonding pads are provided in the bonding area;
the driving chip comprises a first area adjacent to the display area and a second area far away from the display area, a plurality of first dummy terminals are provided in the first area, a plurality of driving terminals are provided in the second area, and the plurality of the driving terminals comprise a plurality of input terminals;
the plurality of the input terminals have one-to-one correspondence with the plurality of the bonding pads; and
the array substrate comprises a base substrate, and the driving chip and the bonding pads are disposed on the base substrate; an end surface of a portion of the array substrate corresponding to the first dummy terminals away from the base substrate is higher than an end surface of a portion of the array substrate corresponding to the bonding pads away from the base substrate.

2. The display panel according to claim 1, wherein a conducting resin is provided between the driving chip and the array substrate, and a plurality of conducting particles are distributed in the conducting resin.

3. The display panel according to claim 1, wherein an insulation protective layer is provided on a part of the array substrate which is corresponding to the first dummy terminals.

4. The display panel according to claim 3, wherein a conducting resin is provided between the driving chip and the array substrate, and a plurality of conducting particles are distributed in the conducting resin.

5. The display panel according to claim 1, wherein the array substrate comprises:
a first metal layer, disposed on a side of the base substrate, and the first metal layer comprising first metal constructions and second metal constructions disposed in the bonding area;
an interlayer insulation layer, disposed on a side of the first metal layer far away from the base substrate;
a second metal layer, disposed on a side of the interlayer insulation layer far away from the base substrate, the second metal layer comprising third metal constructions and fourth metal constructions disposed in the bonding area, the third metal constructions being electrically connected with the first metal constructions, and the fourth metal constructions being electrically connected with the second metal constructions;
a planarization layer, disposed on a side of the second metal layer far away from the base substrate, the planarization layer covering the fourth metal constructions, first openings being defined on the planarization layer, and the third metal constructions being exposed from the first openings;
a passivation layer, disposed on a side of the planarization layer far away from the base substrate, second openings being defined on the passivation layer, and the second openings being corresponding to the first openings; and
a first transparent conducting layer, disposed on a side of the passivation layer far away from the base substrate, the first transparent conducting layer, comprising first transparent conducting members disposed in the bonding area, and the first transparent conducting members are disposed on sides of the third metal constructions far away from the base substrate;
wherein the bonding pads comprise the first metal constructions, the third metal constructions, and the first transparent conducting members, and the insulation protective layer comprises the planarization layer and the passivation layer.

6. The display panel according to claim 5, wherein the first metal layer further comprises fifth metal constructions disposed in the bonding area, the second metal layer further comprises sixth metal constructions disposed in the bonding area, and the first transparent conducting layer further comprises second transparent conducting members disposed in the bonding area;
the planarization layer further comprises third openings, and the sixth metal constructions are exposed from the third openings;
the passivation layer further comprises fourth openings corresponding to the third openings; and
the fifth metal constructions, the sixth metal constructions, and the second transparent conducting members make up the dummy pads.

7. The display panel according to claim 1, wherein a plurality of second dummy terminals are also provided in the first area, a plurality of dummy pads are also provided in the bonding area, and the plurality of the second dummy terminals have one-to-one correspondence with the plurality of the dummy pads.

8. The display panel according to claim 7, wherein the end surface of the portion of the array substrate corresponding to the first dummy terminals away from the base substrate is higher than an end surface of a portion of the array substrate corresponding to the dummy pads away from the base substrate.

9. The display panel according to claim 1, wherein a plurality of second dummy terminals are also provided in the first area, a plurality of dummy pads are also provided in the bonding area, and the plurality of the second dummy terminals have one-to-one correspondence with the plurality of the dummy pads.

10. The display panel according to claim 9, wherein the end surface of the portion of the array substrate corresponding to the first dummy terminals away from the base substrate is higher than an end surface of a portion of the array substrate corresponding to the dummy pads away from the base substrate.

11. The display panel according to claim 9, wherein the first area comprises a first sub area and a second sub area located on both sides, and an intermediate area located between the first sub area and the second sub area, the plurality of the first dummy terminals are disposed in the first sub area and the second sub area, and the plurality of the second dummy terminals are disposed in the intermediate area.

12. The display panel according to claim 11, wherein the second area comprises a third sub area corresponding to the first sub area, a fourth sub area corresponding to the intermediate area, and a fifth sub area corresponding to the second sub area;
wherein distances between each of the driving terminals in a same row in the fourth sub area and the first area are equal; along a direction from the third sub area to the fourth area, distances between each of the driving terminals in a same row in the third sub area and the first area are gradually decreased, and distances between each of the driving terminals in a same row in the fifth sub area and the first area are gradually increased.

13. The display panel according to claim 11, wherein the plurality of the driving terminals in the second area are arranged in at least two rows, and distances between each of the driving terminals in a same row and the first area are equal.

14. The display panel according to claim 13, wherein the second area comprises a third sub area corresponding to the first sub area, a fourth sub area corresponding to the intermediate area, and a fifth sub area corresponding to the second sub area; and wherein each row of the driving terminals in the fourth sub area correspond to at least two rows of the driving terminals in the third sub area and the fifth sub area.

15. The display panel according to claim 9, wherein the first area comprises a first sub area and a second sub area located on both sides, and an intermediate area located between the first sub area and the second sub area, the plurality of the first dummy terminals are disposed in the intermediate area, and the plurality of the second dummy terminals are disposed in the first sub area and the second sub area.

16. The display panel according to claim 9, wherein the driving chip comprises a base body, the first dummy terminals and the second dummy terminals are disposed on a side of the base body adjacent to the array substrate; a distance between an end surface of the first dummy terminals far away from the base body and the base body is less than a distance between an end surface of the second dummy terminals far away from the base body and the base body.

17. The display panel according to claim 1, wherein the array substrate comprises:
a base substrate;
a first metal layer, disposed on a side of the base substrate, and the first metal layer comprising first metal constructions and second metal constructions disposed in the bonding area;
an interlayer insulation layer, disposed on a side of the first metal layer far away from the base substrate;
a second metal layer, disposed on a side of the interlayer insulation layer far away from the base substrate, the second metal layer comprising third metal constructions and fourth metal constructions disposed in the bonding area, the third metal constructions being electrically connected with the first metal constructions, and the fourth metal constructions being electrically connected with the second metal constructions;
a planarization layer, disposed on a side of the second metal layer far away from the base substrate, the planarization layer covering the fourth metal constructions, first openings being defined on the planarization layer, and the third metal constructions being exposed from the first openings;
a passivation layer, disposed on a side of the planarization layer far away from the base substrate, second openings being defined on the passivation layer, and the second openings being corresponding to the first openings; and
a first transparent conducting layer, disposed on a side of the passivation layer far away from the base substrate, the first transparent conducting layer, comprising first transparent conducting members disposed in the bonding area, and the first transparent conducting members are disposed on sides of the third metal constructions far away from the base substrate;
wherein the bonding pads comprise the first metal constructions, the third metal constructions, and the first transparent conducting members, and the insulation protective layer comprises the planarization layer and the passivation layer.

18. The display panel according to claim 1, wherein the display panel further comprises a flexible printed circuit board disposed in the bonding area, the flexible printed circuit board comprises a main body section and connecting sections, the main body section is disposed on a side of the driving chip far away from the display area, and the connecting sections are disposed on two opposite sides of the driving chip; the driving terminals further comprise a plurality of output terminals, and the plurality of the output terminals are electrically connected with the flexible printed circuit board.

19. A display device, comprising a display panel,
wherein the display panel comprises an array substrate, the array substrate comprises a display area and a bonding area, the bonding area is positioned on a side of the display area, and a driving chip and a plurality of bonding pads are provided in the bonding area;
the driving chip comprises a first area adjacent to the display area and a second area far away from the display area, a plurality of first dummy terminals are provided in the first area, a plurality of driving terminals are provided in the second area, and the plurality of the driving terminals comprise a plurality of input terminals;
the plurality of the input terminals have one-to-one correspondence with the plurality of the bonding pads; and
the array substrate comprises a base substrate, and the driving chip and the bonding pads are disposed on the base substrate; an end surface of a portion of the array substrate corresponding to the first dummy terminals away from the base substrate is higher than an end surface of a portion of the array substrate corresponding to the bonding pads away from the base substrate.

* * * * *